(12) United States Patent
Kang et al.

(10) Patent No.: US 6,940,354 B2
(45) Date of Patent: Sep. 6, 2005

(54) MICROWAVE POWER AMPLIFIER

(75) Inventors: Dong Min Kang, Daejon-Shi (KR);
Hyung Sup Yoon, Daejon-Shi (KR);
Hea Cheon Kim, Daejon-Shi (KR);
Kyoung Ik Cho, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 11 days.

(21) Appl. No.: 10/735,037

(22) Filed: Dec. 11, 2003

(65) Prior Publication Data

US 2004/0124926 A1 Jul. 1, 2004

(30) Foreign Application Priority Data

Dec. 18, 2002 (KR) ................................. 10-2002-0081473

(51) Int. Cl.[7] ............................. H03F 3/68; H03F 3/191
(52) U.S. Cl. ....................... 330/295; 330/302; 330/310
(58) Field of Search .............................. 330/124 R, 286, 330/295, 302, 306, 310, 311

(56) References Cited

U.S. PATENT DOCUMENTS 4,127,750 A * 11/1978 Prudhon et al. ............ 370/282
5,694,085 A * 12/1997 Walker ....................... 330/295

FOREIGN PATENT DOCUMENTS

| JP | 2000-138546 | 5/2000 |
|---|---|---|
| JP | 1020020051976 | 7/2002 |

OTHER PUBLICATIONS

IEEE Transactions on Microwave Theory and Techniques, vol., 49, No. 6, Jun. 2001, "Millimeter–Wave Monolithic Power Amplifier for Mobile Borad–Band Systems" J. Caldinhas Vaz, et al., pp. 1211–1215.

* cited by examiner

Primary Examiner—Steven J. Mottola
(74) Attorney, Agent, or Firm—Blakely Sokoloff Taylor & Zafman

(57) ABSTRACT

A microwave power amplifier comprising a drive amplifying stage includes power elements, gate and drain bias circuits of the power elements, a RC parallel circuit connected between input port and gates of said power elements, a shunt resistor connected between ground terminal and said gates of power elements, and a negative feedback circuit connected in series with resistors and capacitors and in parallel with the power elements. An interstage matching circuit is connected in series with the drive amplifying stage; and a power amplifying stage including power elements connected in parallel with a power divider and a power coupler, gate and drain bias circuits of said power elements, a RC parallel circuit connected between the gates of power elements and the interstage matching circuit, and a shunt resistor connected between a ground and the gates of power elements.

5 Claims, 4 Drawing Sheets

MICROWAVE POWER AMPLIFIER

BACKGROUND OF THE INVENTION

1. Field of the Invention

The present invention relates to a microwave power amplifier, in particular, to the microwave power amplifier using negative feedback circuits, RC parallel circuits, and shunt resistors.

2. Description of the Prior Art

High-valued gains in a low frequency band are obtained due to a device's characteristic when designing a power amplifier in the millimeter-wave band. And, an oscillation may always occur in the low frequency band due to a limitation of modeling.

In the prior art, a feedback circuit has been employed in the power amplifier for stabilizing the amplifying device. For example, see the following publication that is incorporated herein by reference: IEEE Trans. On MTT, Vol 49 to Joao Caldinhas Vaz et al entitled "Millimeter-Wave Monolithic Power Amplifier for Mobile Broad-Band Systems" issued in June 2001, which discloses a MMIC (microwave monolithic integrated circuit) power amplifier for applying to a 60 GHz MBS (Mobile Broad-Band System). In this publication the 3-stage MMIC power amplifier was designed in two types such as a single-ended type and a balanced type by using 0.15 um PMHFET (Peudomorphic heterojuntion FET), and applies a RC feedback network to first and second stage transistors in negative feedback manner for achieving unconditional stability of a millimeter-wave transistor.

In addition, Korea patent number 2000-81018 that is incorporated herein by reference and issued on Dec. 23, 2000, discloses a radio frequency power amplifier using a feedback circuit and a method for designing the amplifier, wherein a feedback circuit is inserted in each stage of the power amplifier so that an unstable amplifying element is absolutely stabilized. It is designed by finding a peak output power point due to an output power change according to an input power of a whole power amplifier circuit, after stabilizing an unstable amplifier device using the feedback circuit in a radio frequency band.

Hereinafter, the feedback microwave power amplifier in accordance with the prior art will be explained with reference to FIGS. 1 and 3.

FIG. 1 shows a circuit for explaining a feedback microwave power amplifier in accordance with the prior art, which consists of gate bias circuit 101, 103, 105, drain bias circuit 102, 104, 106, negative feedback circuit 107, 109, HEMT (High Electron Mobility Transistor) devices 113, 114, 115, 116, inter-stag e matching circuits 108, 110, a power divider 111, and a power combiner 112.

Referring to FIG. 1, a 3-stage power amplifier utilizes feedback circuits 107, 109 in the first sage and the second stage to meet stability conditions, and interstage matching circuits 108, 110 are connected between stages to obtain interstage matching. Gate bias circuits 101, 103, 105 and drain bias circuits 102, 104, 106 are separately applied to each stage, and at the last stage, HEMT devices 115, 116 are connected in parallel with each other by applying the power divider 111 and the power combiner 112 to enhance power characteristics.

FIG. 3 shows a graph representing input/output characteristics and gain of the feedback microwave power amplifier shown in FIG. 1.

Referring to FIG. 3, when the power amplifier was designed by using only a feedback circuit, unconditional stability conditions were met in terms of stability. However, when only a negative feedback circuit is applied to the power amplifier, potential oscillation may occur at any time due to a mis-match in a low frequency band, as is shown in gain characteristics 301 and input return loss characteristics 302 in the low frequency band. In other words, the power amplifier employing the feedback circuit in accordance with the above described prior art still has a potential oscillation problem in the low frequency band.

SUMMARY OF THE INVENTION

Therefore, the object of the present invention is to provide a single chip microwave power amplifier capable of being stable from the low frequency band to the microwave band by using negative feedback circuits, RC parallel circuits, and shunt resistances.

To achieve the above object, the microwave power amplifier comprises a drive amplifying stage including power devices, gate and drain bias circuits of said power devices, a RC parallel circuit connected between input port and gates of said power devices, a shunt resistor connected between ground terminal and said gates of power devices, and a negative feedback circuit connected in series with resistors and capacitors and in parallel with said power devices; an interstage matching circuit connected in series with said drive amplifying stage; and a power amplifying stage including power devices connected in parallel with a power divider and a power combiner, gate and drain bias circuits of said power devices, a RC parallel circuit connected between said gates of power devices and said interstage matching circuit, and a shunt resistor connected between a ground and said gates of power devices.

DESCRIPTION OF THE PREFERRED EMBODIMENTS

Hereinafter, embodiments of the present invention will be explained with reference to the accompanying drawings. Although the present invention has been described in conjunction with the preferred embodiment, the present invention is not limited to the embodiments, and it will be apparent to those skilled in the art that the present invention can be modified in variation within the scope of the invention.

Figure 1:
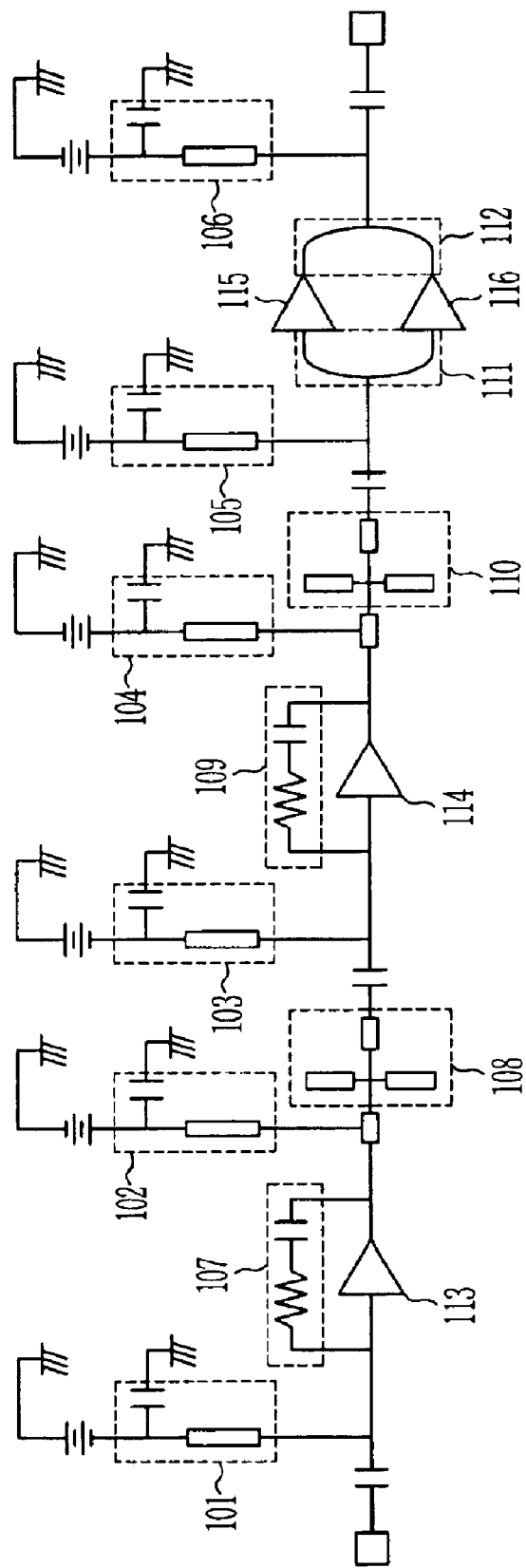
FIG. 1 shows a circuit for explaining a feedback microwave power amplifier in accordance with the prior art.
Figure 2:
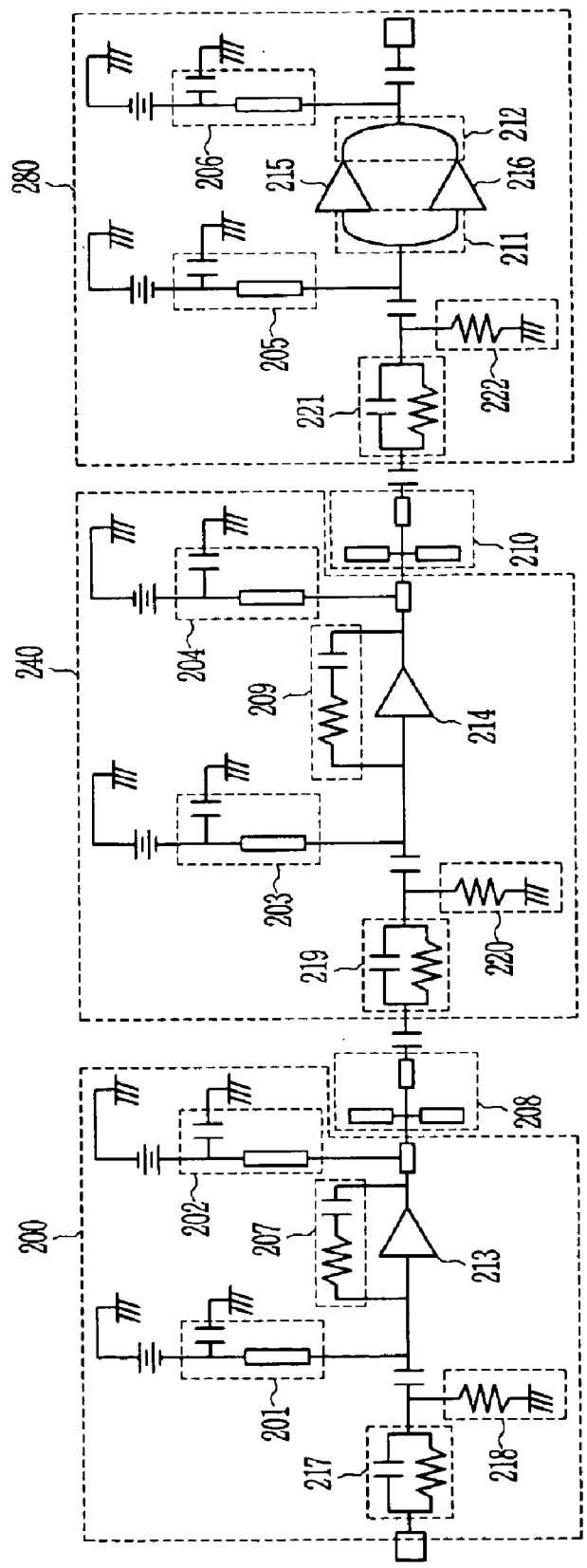
FIG. 2 shows a circuit for explaining a configuration of the microwave power amplifier in accordance with a preferred embodiment of the present invention.
Figure 3:
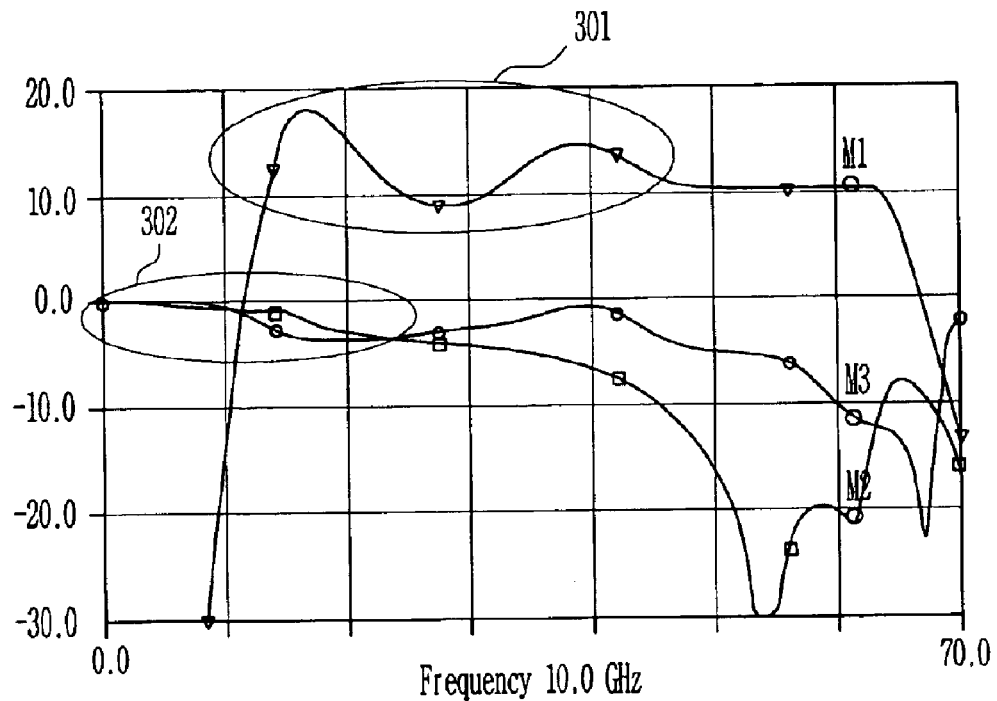
FIG. 3 shows a graph representing input/output characteristics and gain of the feedback microwave power amplifier shown in FIG. 1.

FIG. 2 shows a circuit for explaining a configuration of the microwave power amplifier in accordance with a preferred embodiment of the present invention. The circuit includes a first drive amplifying stage 200, a second drive amplifying stage 240, and a third power amplifying stage 280. Hereinafter, the microwave power amplifier using a negative feedback circuit, a RC parallel circuit, and a shunt resistor in accordance with the preferred embodiment of the present invention will be described in detail.

Referring to FIG. 2, the microwave power amplifier using negative feedback circuits, RC parallel circuits, and shunt resistances uses negative feedback circuits 207, 209, RC parallel circuits 217, 219, and shunt resistors 218, 220 in drive stages such as the first drive amplifying stage 200 and the second drive amplifying stage 240 in order to meet unconditional stability conditions and broadband characteristics. In addition, a RC parallel circuit 221 and a shunt resistor 222 are utilized in a power stage such as the third power amplifying stage 224 to meet absolute stability conditions. The power matching is achieved to obtain maximum output power by using the power divider 211 and the power combiner 212, with amplifying devices 215, 216 formed in parallel with each other. The inter-stage matching circuits 208, 210 may be inserted between the first drive amplifying stage 200 and the second drive amplifying stage 240, and between the second drive amplifying stage 240 and the third power amplifying stage 280. The inter-stage matching circuits 208, 210 may include micro-strip lines and open stubs. The inter-stage matching circuits 208, 210 function as supplying gain without loss with regard to power matching of the output. Those inter-stage matching circuits 208, 210 may be separated by capacitors for DC blocking between each of stages.

The first drive amplifying stage 200 includes a power device 213 for raising signal level, input matching circuits 201, 217, 218 designed for transmitting input signal without loss, a RC parallel circuit 217, a shunt resistor 218, a negative feedback circuit 207, a gate bias circuit 201, and a drain bias circuit 202.

The power device 213 can be implemented as a HEMT (High Electron Mobility Transistor), and the RC parallel circuit 217 is connected in series between the input port and the gate of the power device 213, and the shunt resistor 218 is connected between the ground terminal and the gate stage of the power device 213. The shunt resistor 218 is a resistor having micro-strip lines connected to both ends thereof, and the ground terminal can be formed of via-holes. A matching component with the input stage can be adjusted by changing resistance of the shunt resistor and adjusting a length of the micro-strip line. And, the negative feedback circuit 207 including resistors and capacitors is positioned in parallel with the power device 213, thereby making an amplifying portion. The gate bias circuit 201 and the drain bias circuit 202 are separated for supplying independent biases, respectively, and it is preferable to provide the DC supply with a pad of GPPPPGPPG (Ground-Pad-Pad-Pad-Pad-Ground-Pad-Pad-Ground) type having 200 um pitch for on-wafer measurement. The interstage matching circuit 208 is connected to the output portion of the power device 213.

The second drive amplifying stage 240 is connected to the first drive amplifying stage 220 through the interstage matching circuit 208 and has the same configuration as the first drive amplifying stage 200. In other words, the second drive amplifying stage 240 includes the power device 214 for increasing signal level, the RC parallel circuit 219, the shunt resistor 220, the negative feedback circuit 209, the gate bias circuit 203, and the drain bias circuit 204.

The power device 214 of the second drive amplifying stage 240 can also be implemented as the HEMT (High Electron Mobility Transistor), and the RC parallel circuit 219 is connected in series between the interstage matching circuit 208 and the gate of the power device 214, and the shunt resistor 220 is connected between the ground terminal and the gate stage of the power device 214. The shunt resistor 220 is a resistor having micro-strip lines connected to both ends thereof, and the ground terminal can be formed of via-holes. And, the negative feedback circuit 209 includes resistors and capacitors positioned with the power device 214 in parallel, and the interstage matching circuit 210 is displaced in the output portion of the power device 214. The gate bias circuit 203 and the drain bias circuit 204 are separated for supplying independent biases, respectively, and it is preferable to provide the DC supply with a pad of GPPPPGPPG (Ground-Pad-Pad-Pad-Pad-Ground-Pad-Pad-Ground) type having 200 um pitch for on-wafer measurement.

The third power amplifying stage 280 includes power devices 215, 216 for amplifying signals transmitted from the first drive amplifying stage 200 and the second drive amplifying stage 240, a RC parallel circuit 221, a shunt resistor 222, a gate bias circuit 205, a drain bias circuit 206, a power divider 211, and a power combiner 212. The third power amplifying stage 280 is connected to the second power amplifying stage 240 through the inter-stage matching circuit 210. It is designed to distribute input signals without loss using the power divider 211 and the power combiner 212, amplify input signals be means of power devices 215, 216 connected in parallel and output the amplified signals coupled without loss, while unconditional stability is maintained using the RC parallel circuit 221 and the shunt resistor 222.

Figure 4:
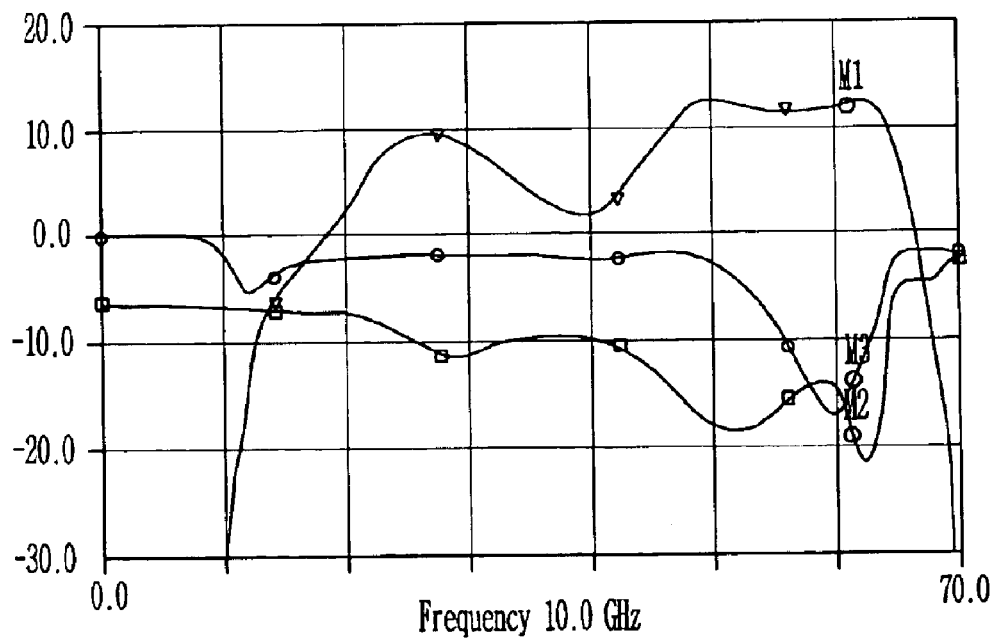
FIG. 4 shows a graph representing input/output characteristics and gain of the feedback microwave power amplifier shown in FIG. 2.

FIG. 4 shows a graph representing input/output characteristics and gain of the feedback microwave power amplifier shown in FIG. 2. In terms of gain and input/output characteristics, a result of design shown in FIG. 2, it can be seen that unconditional stability in whole band from the low frequency band to the microwave band, while the possibility of oscillation due to a mis-match is completely eliminated, as is shown in the input return loss characteristic 402 and gain characteristic 401 in the low frequency band.

Figure 5:
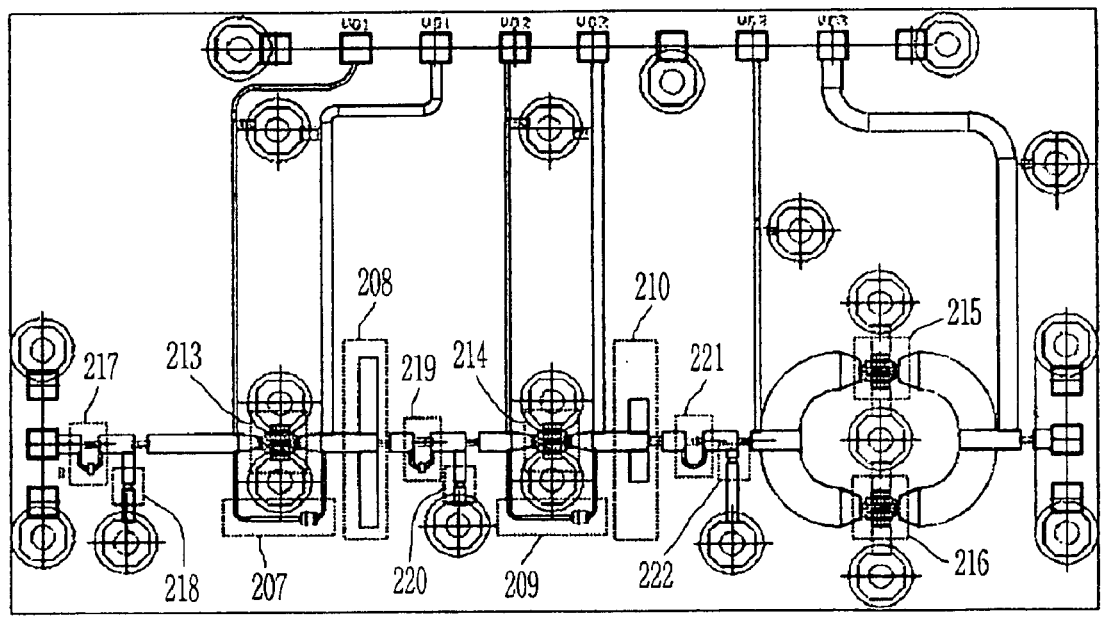
FIG. 5 shows a layout of FIG. 2.

FIG. 5 shows a layout of FIG. 2. As shown in FIG. 5, the power amplifier of the present invention is designed such that the RC parallel circuit is positioned in series between the gate of the power device and the input port of the first drive amplifying stage, a resistor between the ground terminal and the gate, and the negative feedback circuit includes resistors and capacitors is connected in parallel with power devices. The second drive amplifying stage is connected to the first drive amplifying stage through the interstage matching circuit. And, the third power amplifying stage is connected to the second drive amplifying stage through the interstage matching circuit. Thus, the power amplifier is implemented as one chip such as integrated circuit.

As described above, the microwave power utilizes negative feedback circuits, RC parallel circuits, and shunt resistors, and has advantages in that it can be designed to control undesired input return loss characteristic and gain characteristic in the low frequency band, and completely block oscillation in the low frequency band, compared to the conventional power amplifier only using feedback circuits.

Therefore, it can have unconditional stability characteristic from the low frequency band to the microwave band, and input matching can be facilitated so that it is applicable in design of a microwave integrated circuit amplifier in the millimeter band.

Although the present invention has been described in conjunction with the preferred embodiment, it is not limited to the embodiments, and it will be apparent to those skilled in the art that the present invention can be modified in variation within the scope of the invention.

What is claimed is:

1. A microwave power amplifier, comprising:
   a drive amplifying stage (200) including
   1) a first power device (213),
   2) a first RC parallel circuit (217) connected between an input port and a gate of said power device,
   3) a first shunt resistor (218) connected between a ground and said gate of said first power devices, and
   4) a negative feedback circuit (207) connected in parallel with said first power device;
   b) an interstage matching circuit (208) connected in series with said drive amplifying stage; and
   c) a power amplifying stage (280) including
   1) a second power device (215) and a third power device (216) connected in parallel with each other and to a power divider (211) and a power combiner (212),
   2) a second RC parallel circuit (221) connected between said second and third power devices and said interstage matching circuit, and
   3) a second shunt resistor (222) connected between said ground and said second and third power devices.

2. The microwave power amplifier as claimed in claim 1, wherein said power devices are HEMTs.

3. The microwave power amplifier as claimed in claim 1, wherein said inter-stage matching circuit utilizes micro-strip lines and open stubs.

4. The microwave power amplifier as claimed in claim 1, wherein said first and second shunt resistors comprise a resistor having micro-strip lines connected to both ends thereof.

5. The microwave power amplifier as claimed in claim 1, wherein said microwave power amplifier further comprises a second drive amplifying stage and a second interstage matching circuit, disposed between said interstage matching circuit and said power amplifying stage.

* * * * *